(12) United States Patent
Gao

(10) Patent No.: US 11,812,582 B2
(45) Date of Patent: Nov. 7, 2023

(54) SYMMETRICAL COLD PLATE DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 57 days.

(21) Appl. No.: 17/093,027

(22) Filed: Nov. 9, 2020

(65) Prior Publication Data
US 2022/0151099 A1    May 12, 2022

(51) Int. Cl.
H05K 7/20    (2006.01)

(52) U.S. Cl.
CPC ..... H05K 7/20254 (2013.01); H05K 7/20781 (2013.01)

(58) Field of Classification Search
CPC ............ H05K 7/20254; H05K 7/20781
See application file for complete search history.

(56) References Cited

U.S. PATENT DOCUMENTS

| | | | |
|---|---|---|---|
| 5,159,529 A | 10/1992 | Lovgren et al. | |
| 5,829,514 A * | 11/1998 | Smith | F28F 3/022 174/16.3 |
| 6,257,320 B1 * | 7/2001 | Wargo | H01L 23/473 174/15.1 |
| 6,367,543 B1 * | 4/2002 | Calaman | F28F 3/022 257/E23.098 |
| 6,609,560 B2 * | 8/2003 | Cho | F28D 15/043 174/15.2 |
| 6,799,628 B1 | 10/2004 | Masseth et al. | |
| 6,988,534 B2 * | 1/2006 | Kenny | G06Q 20/20 174/15.1 |
| 7,237,337 B2 * | 7/2007 | Yeh | F28D 15/0266 29/890.032 |
| 7,262,966 B2 * | 8/2007 | Liao | H01L 23/427 361/705 |

(Continued)

FOREIGN PATENT DOCUMENTS

WO    WO-2014112600 A1 *  7/2014  ........... B23P 15/26

OTHER PUBLICATIONS

WO-2014112600-A1 mt (Year: 2014).*

*Primary Examiner* — Gordon A Jones
(74) *Attorney, Agent, or Firm* — WOMBLE BOND DICKINSON (US) LLP

(57) ABSTRACT

Embodiments are disclosed of a cold plate including substantially identical first and second frames. The first frame includes a first frame body with a first recess, a first mating surface surrounding the first recess, and a first plurality of heat transfer fins in the first recess. The second frame includes a second frame body with a second recess, a second mating surface surrounding the second recess, and a second plurality of heat transfer fins in the second recess. The second mating surface is in sealing contact with the first mating surface, so that the first and second recesses form a fluid chamber. The first and second pluralities of heat transfer fins form a plurality of fin channels in the fluid chamber. Advanced sealing structures can be formed between the first and second mating surfaces. A first fluid port and a second fluid port are fluidly coupled via fluid channels to the plurality of fin channels.

17 Claims, 13 Drawing Sheets

(56) References Cited

U.S. PATENT DOCUMENTS

| | | | | |
|---|---|---|---|---|
| 7,836,597 B2* | 11/2010 | Datta | .................. | H01L 21/4882 |
| | | | | 29/890.032 |
| 8,829,670 B1* | 9/2014 | Zhang | ................ | H01L 21/4871 |
| | | | | 257/713 |
| 9,345,169 B1* | 5/2016 | Campbell | .......... | H05K 7/20327 |
| 9,406,585 B2 | 8/2016 | Mori et al. | | |
| 10,160,072 B2* | 12/2018 | Boday | ................ | H05K 7/20254 |
| 10,468,332 B2* | 11/2019 | Yamada | ................ | H01L 23/367 |
| 11,569,629 B2* | 1/2023 | Pardhan | ................ | G01S 17/931 |
| 2006/0157227 A1* | 7/2006 | Choi | ..................... | H01L 23/427 |
| | | | | 165/104.21 |
| 2009/0139693 A1* | 6/2009 | Qu | .......................... | F28F 3/048 |
| | | | | 165/80.4 |
| 2009/0178792 A1 | 7/2009 | Mori et al. | | |
| 2012/0255718 A1* | 10/2012 | Klett | ......................... | B26F 1/02 |
| | | | | 165/185 |
| 2013/0292383 A1* | 11/2013 | Mullaney | ............... | H05K 5/062 |
| | | | | 277/654 |
| 2014/0158330 A1 | 6/2014 | Kuroda et al. | | |
| 2017/0043437 A1* | 2/2017 | Boday | ................ | H05K 7/20772 |
| 2018/0209749 A1* | 7/2018 | Wright | ...................... | F28F 3/02 |
| 2018/0259267 A1 | 9/2018 | Tsai et al. | | |
| 2020/0025641 A1* | 1/2020 | Long | .................. | H05K 7/20254 |
| 2020/0229321 A1* | 7/2020 | Dogruoz | ............ | G02B 6/4269 |
| 2020/0275583 A1* | 8/2020 | Lee | ......................... | H05K 7/205 |
| 2021/0273283 A1* | 9/2021 | Dittmann | ............ | H01M 50/503 |
| 2021/0372713 A1* | 12/2021 | Graham | ............. | H01L 23/3672 |
| 2022/0087062 A1* | 3/2022 | Kuriyagawa | ....... | H01M 10/613 |
| 2022/0110225 A1* | 4/2022 | Edmunds | ........... | H05K 7/20772 |

* cited by examiner

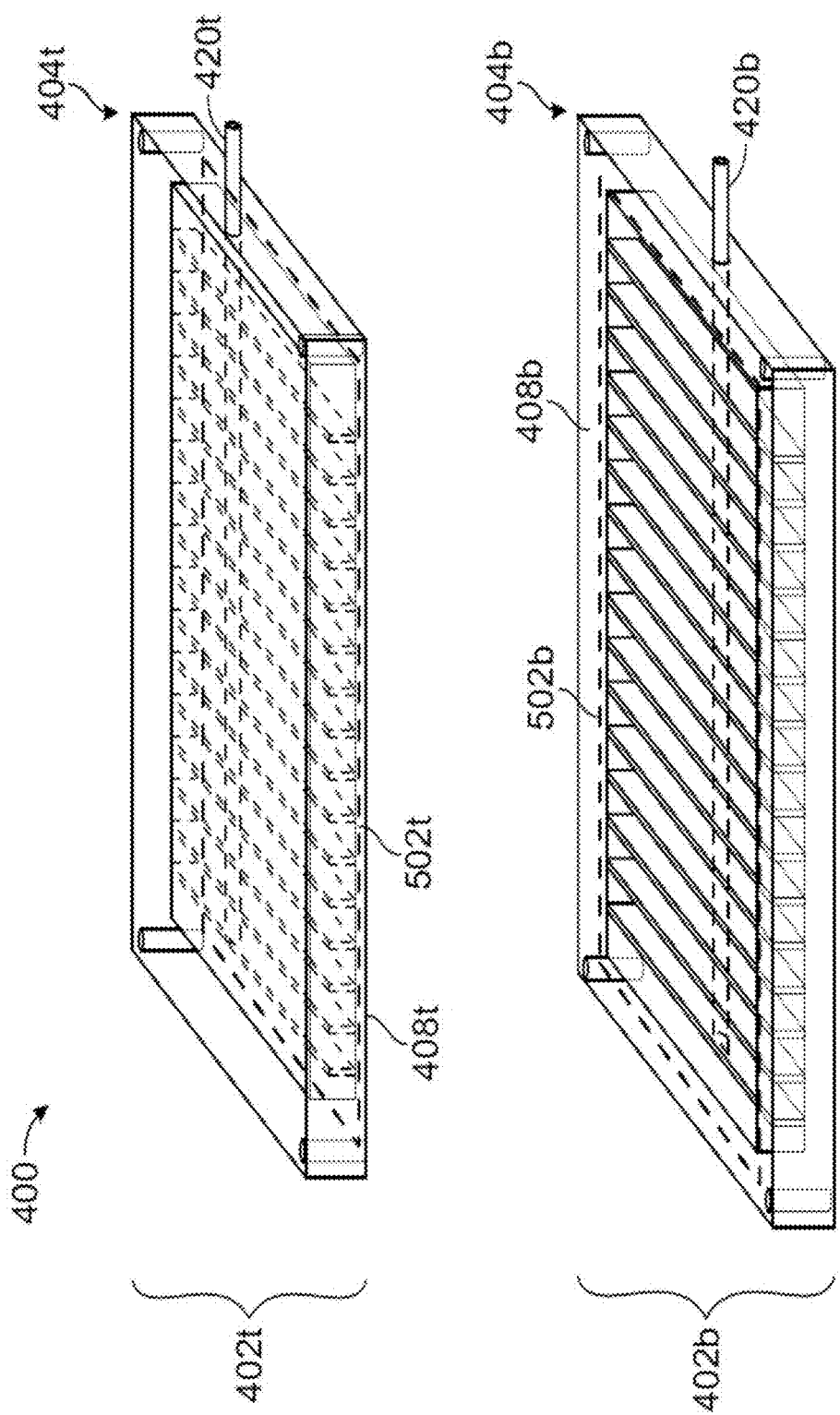

SYMMETRICAL COLD PLATE DESIGN

TECHNICAL FIELD

The disclosed embodiments relate generally to liquid cooling systems for electronic equipment and in particular, but not exclusively, to a cold plate for use in liquid cooling systems.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Modern IT equipment therefore requires liquid cooling or liquid-air hybrid cooling.

Cold plates are an element used in many liquid cooling solutions. Cold plates are elements that are coupled to heat-generating components. Once the cold plate is coupled to a heat-generating component, liquid circulates through it to remove the heat. There are currently several challenges in using liquid cooling to remove heat through cold plates:

- Improving cold plate design and manufacturing efficiency;
- Improving performance and usability of liquid-cooling cold plates;
- Supporting cost reduction and providing better performance/cost;
- Enhancing reliability;
- Continue to support increasing power requirements and their correspondingly increasing heat generation; and
- Scalability for different and ever changing electronic packaging platforms.

BRIEF DESCRIPTION OF THE DRAWINGS

Non-limiting and non-exhaustive embodiments of the invention are described below with reference to the following figures, wherein like reference numerals refer to like parts throughout the various views unless otherwise specified.

FIG. 4A is an exploded perspective drawing; FIG. 4B is a top view of an embodiment of a frame; FIG. 4C is a side view of an embodiment of a frame; FIG. 4D is a side view of a pair of frames being assembled; and FIG. 4E is a side view of an embodiment of an assembled cold plate; FIG. 4F is an exploded perspective view showing the fluid flow path through the cold plate during an embodiment of its operation.

FIGS. 5A-5B are exploded perspective drawings of embodiments of sealing arrangements in a cold plate.

FIG. 6A is an exploded view, FIG. 6B an assembled view.

FIG. 9A is a perspective view, FIG. 9B-9C cross-sectional views.

DETAILED DESCRIPTION

Figure 1:
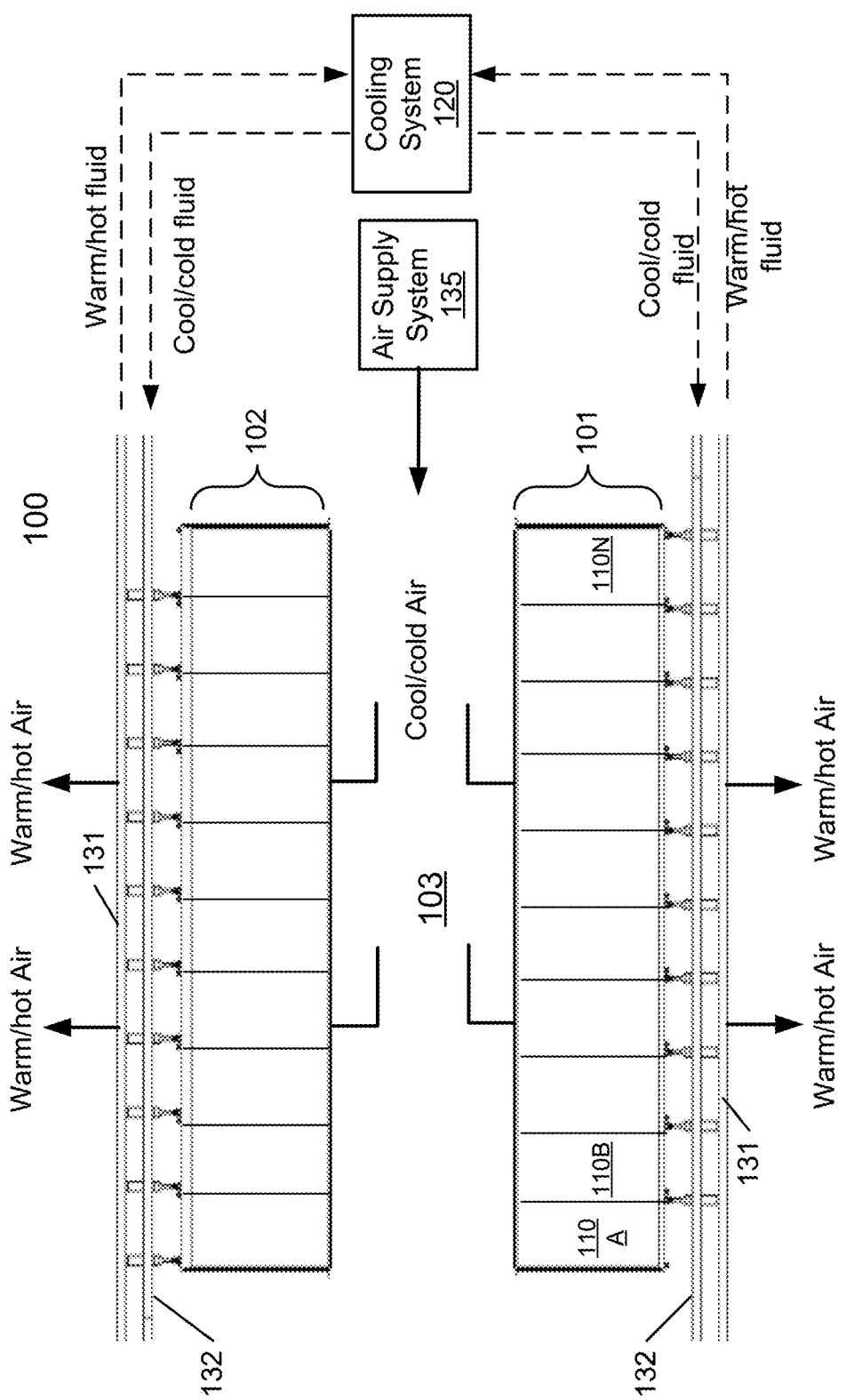
FIG. 1 is a block diagram of an embodiment of a data center facility.

Embodiments are described of a cold plate for use in liquid cooling systems. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional terms should not be interpreted to imply or require any particular orientation of the described embodiments when in actual use.

The described embodiments provide an advanced structure for liquid cooling that not only simplifies design and manufacturing, but also provide higher availabilities for different electronics cooling scenarios. In addition, the disclosed embodiments provide better thermal management performance, which may benefit high power density processors and electronic packages. The described embodiments also simplify cold plate based liquid cooling solutions without sacrificing performance. A simplified design for such solutions directly impacts reliability, availability, manufacturability, cost, and many other factors.

An overall cold plate structure is proposed for liquid cooling for electronics. A full symmetric design is used for the cold plate assembly, meaning that the cold plate has an upper portion and lower portion that are identical, so that usability is improved and the corresponding manufacturability is increased. The detailed internal structural including the fin channel, water fin, as well as the fluid inlet and outlet channel are described. Fluid distribution design enables enhanced heat transfer performance. An advanced sealing structure design is disclosed for enhancing reliability of the design; the thermal expansion feature of the sealing pad may provide even higher reliability of the cold plate assembly. Finally, a mounting structure is described as an alternative design for cold plate integration.

FIG. 1 is a block diagram of at least a portion of an embodiment of a data center 100. Data center system 100 includes one or more rows of electronic racks of information technology (IT) components, equipment or instruments 101-102, such as, for example, computer servers or computing nodes that provide data services to a variety of clients over a network (e.g., the Internet). In this embodiment each row includes an array of electronic racks such as electronic racks 110A-110N, but more or fewer rows of electronic racks may be implemented. Typically, rows 101-102 are aligned in parallel with front ends facing towards each other and back ends facing away from each other, forming aisle 103 in between to allow passage to an administrator. However, other configurations or arrangements may also be applied. For example, two rows of electronic racks may face each other back-to-back without forming an aisle in between, while their front ends face away from each other. The back ends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their front ends and the warm/hot airflows exit the electronic racks from their back ends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
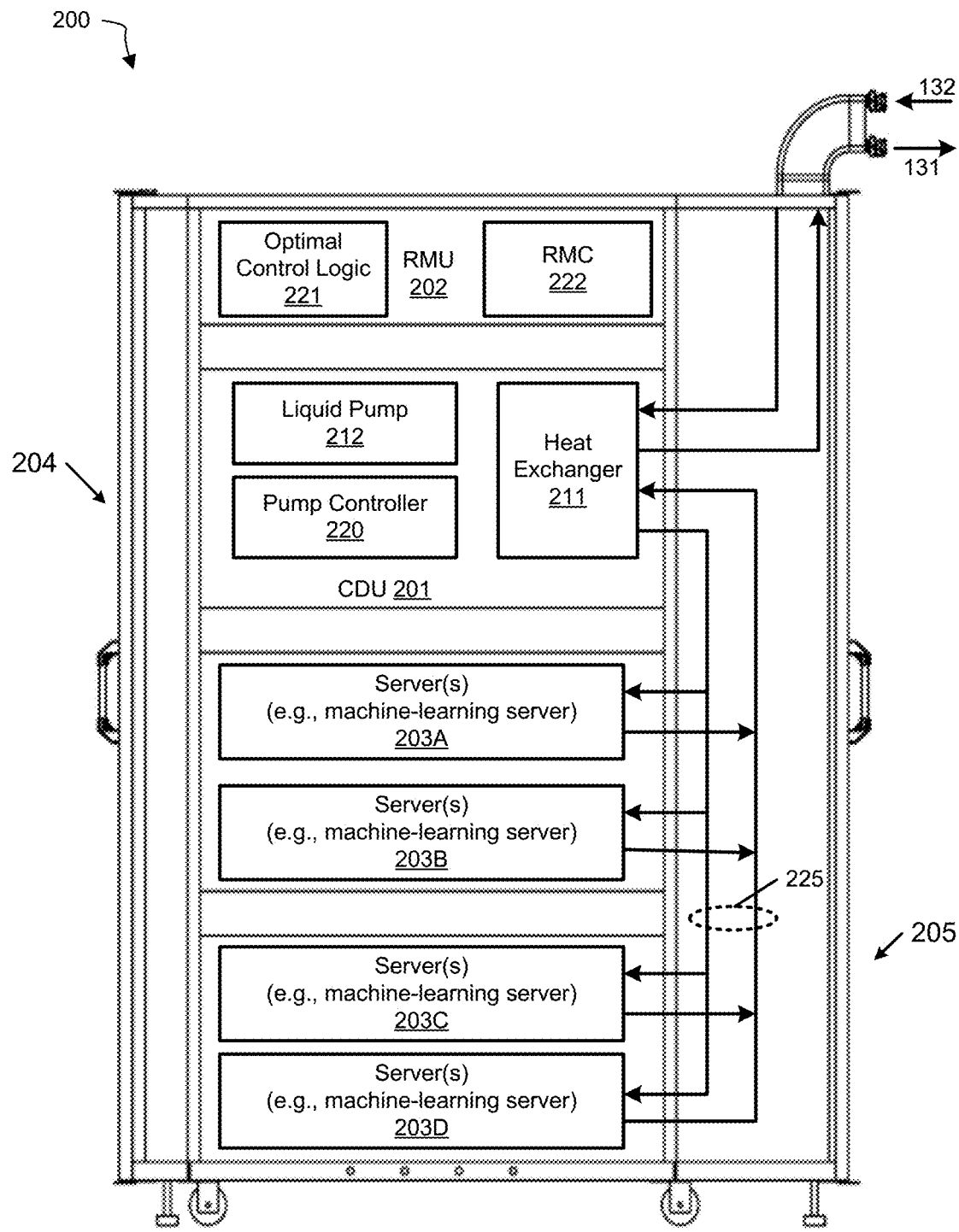
FIG. 2 is a block diagram of an embodiment of an IT container including an electronic rack with electronics and cooling systems housed within.

FIG. 2 is a block diagram illustrating a side view of an embodiment of an electronics rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 211, liquid pump 212, and pump controller 210. Heat exchanger 211 can be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 can be disposed or mounted on back end 205 of electronic rack 200. In addition, heat exchanger 211 further includes a second tube having a second pair of liquid connectors coupled to liquid manifold 225, which can include a supply manifold to supply cooling liquid to server blades 203 and a return manifold to return warmer liquid back to CDU 201. The processors can be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each server blade 203 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 203 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 200 further includes RMU 202 configured to provide and manage power supplied to server blades 203 and CDU 201. RMU 202 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 220 to control the pump speed of liquid pump 212 based on the optimal pump speed.

Figure 3:
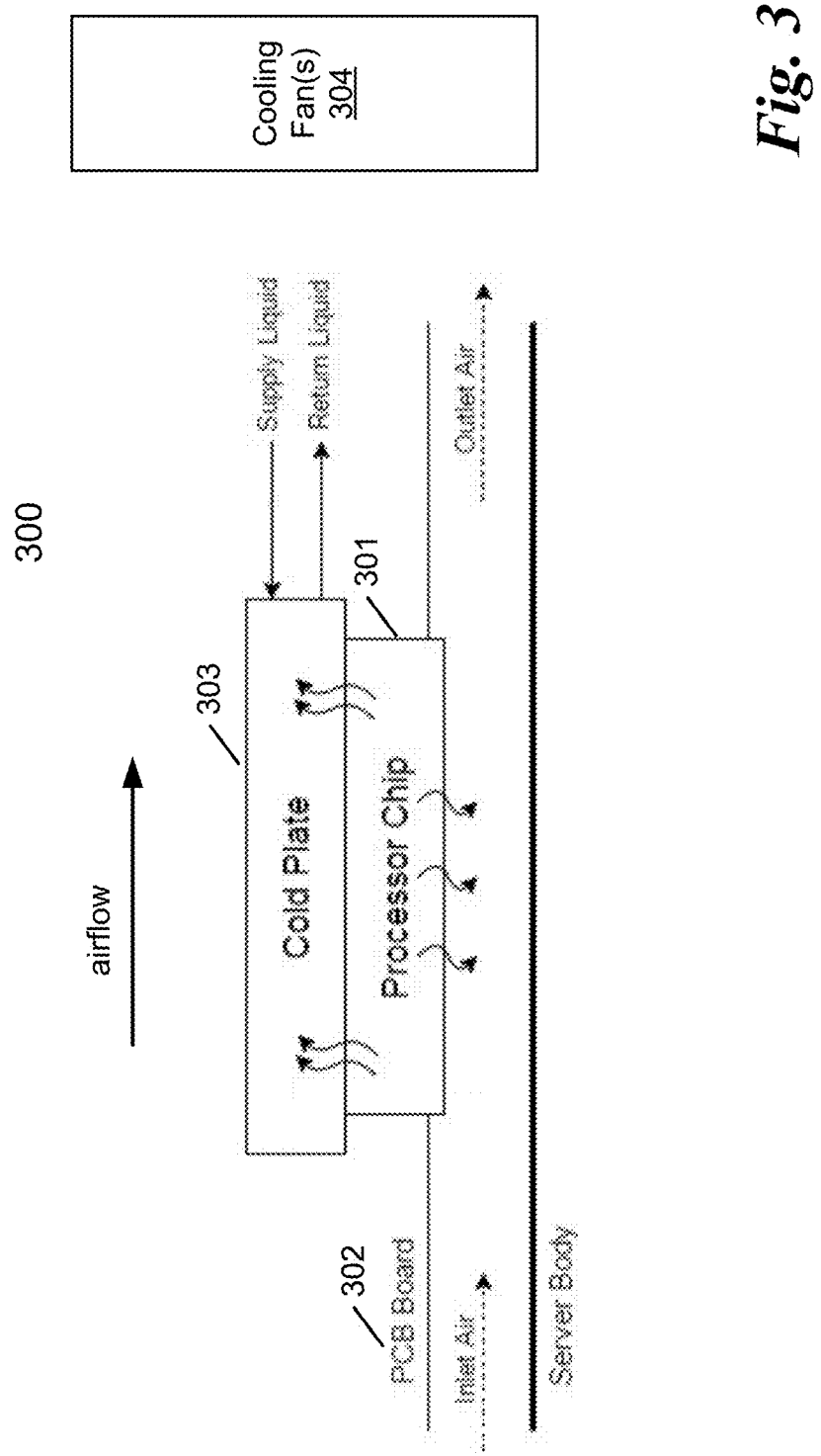
FIG. 3 is a block diagram of an embodiment of a cold plate configuration.

FIG. 3 illustrates an embodiment of a processor/cold plate configuration 300. The processor/cold plate assembly 300 can represent any of the processors/cold plate structures of server chassis 203 as shown in FIG. 2. Processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131. A portion of the heat generated by processor 301 is removed by the cooling liquid via cold plate 303. The remaining portion of the heat enters into an air space underneath or above, which may be removed by an airflow generated by cooling fan 304. Cold plate 303 can be any of the cold plate embodiments discussed below in connection with FIG. 4A et seq.

Figure 4A:
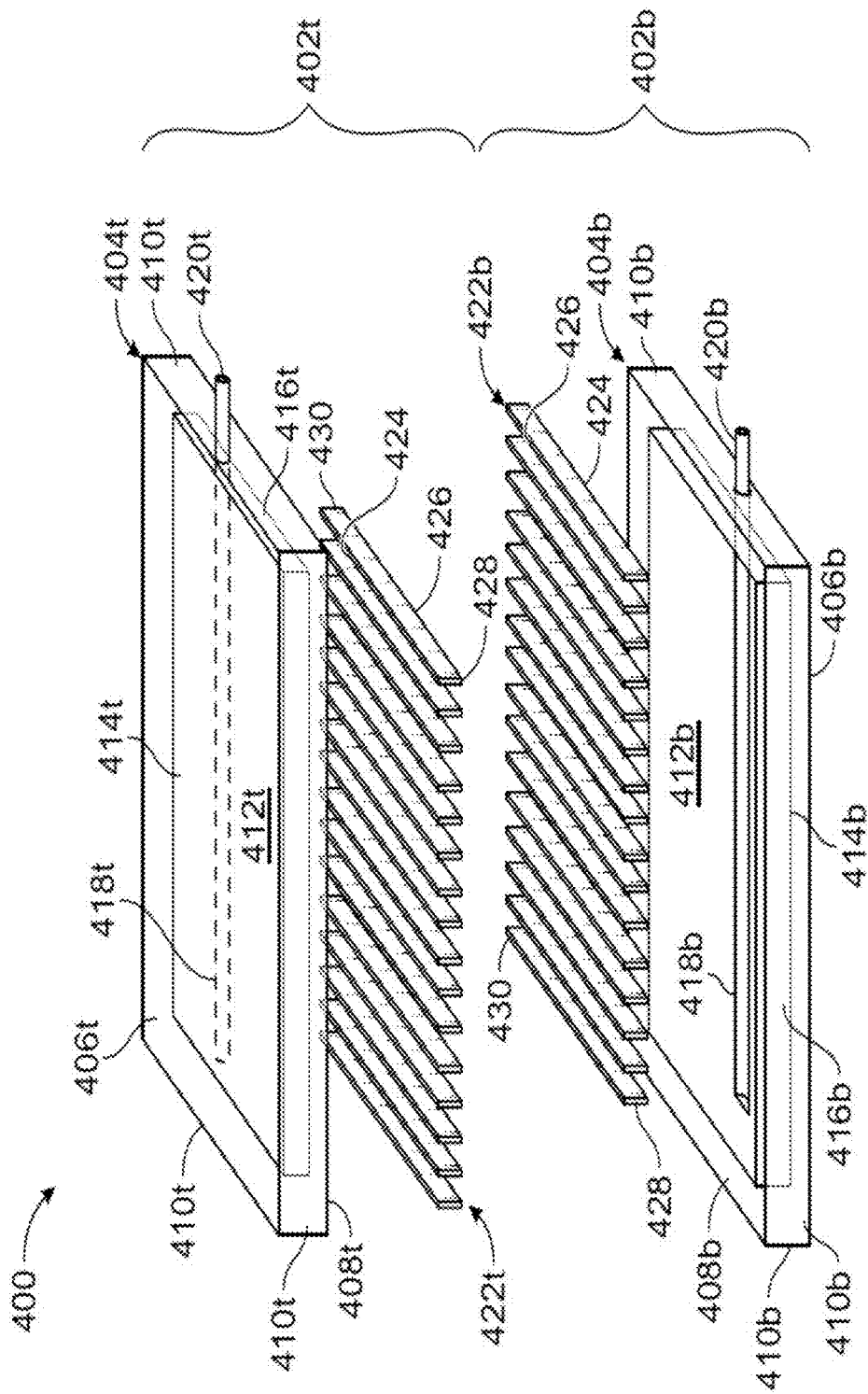
FIGS. 4A-4F are drawings of an embodiment of a cold plate.
Figure 4B:
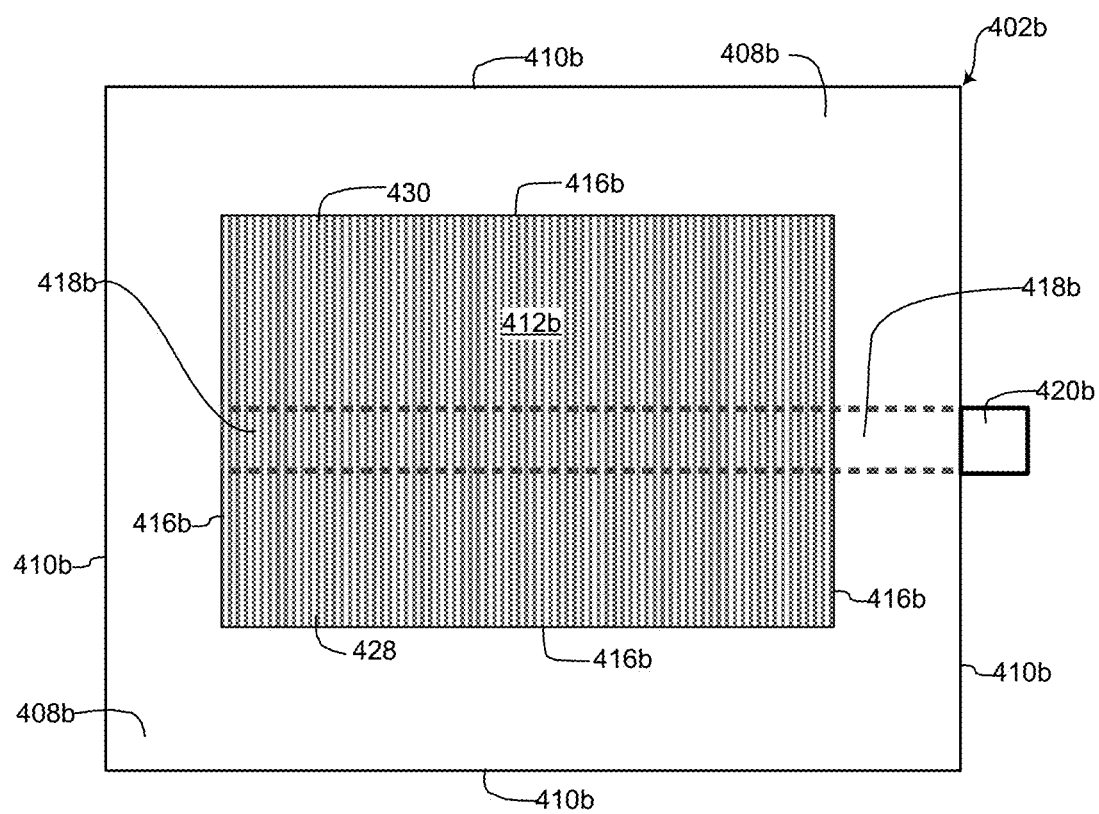
Figure 4C:
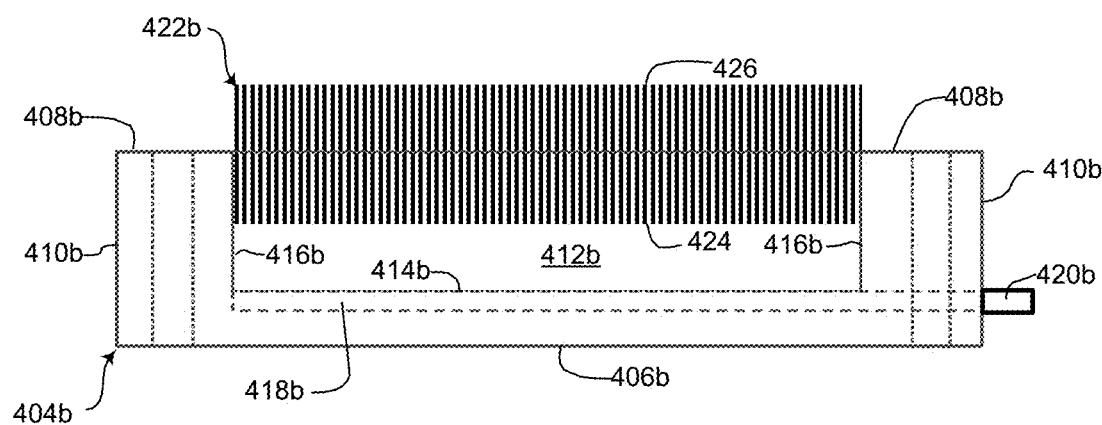
Figure 4D:
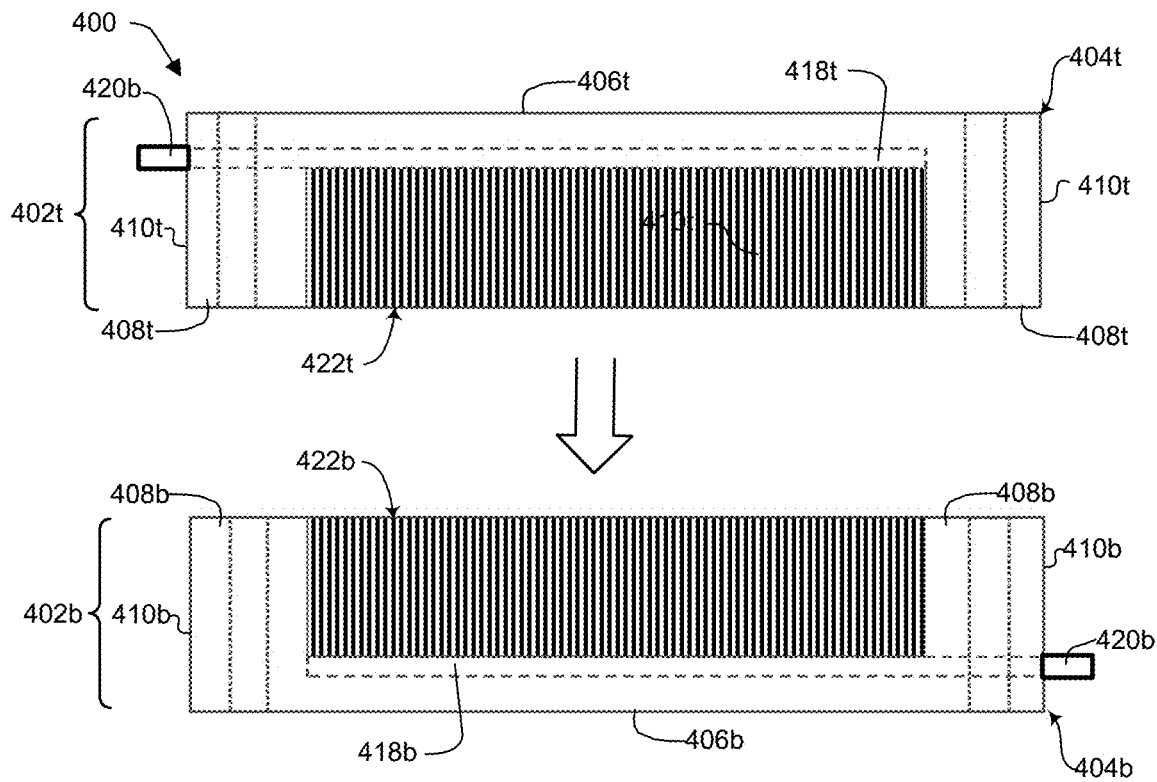
Figure 4E:
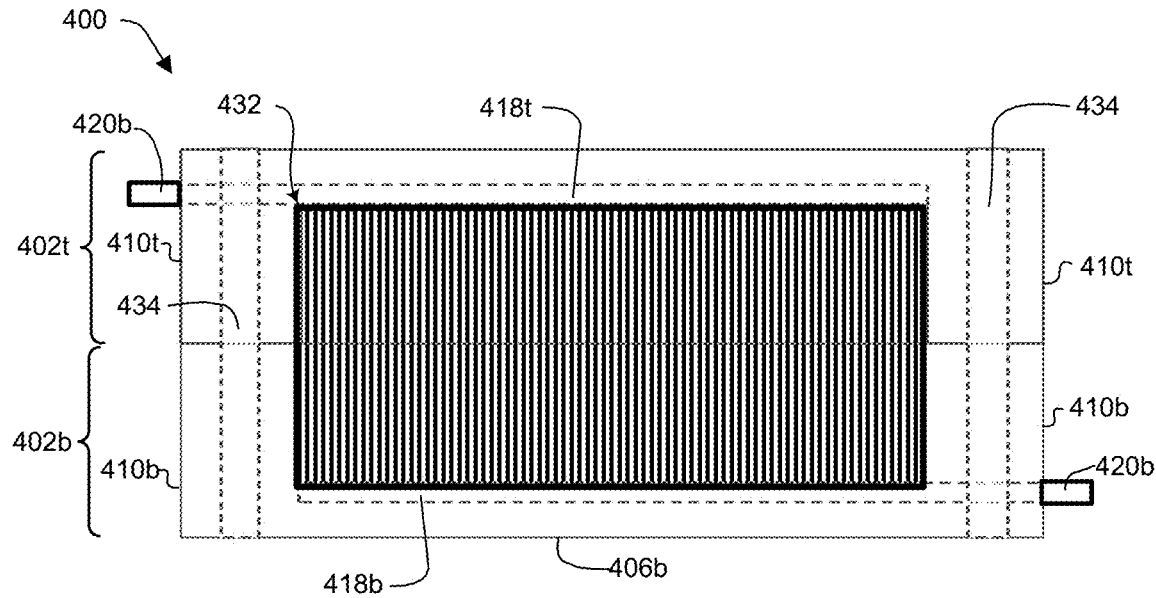
Figure 4F:
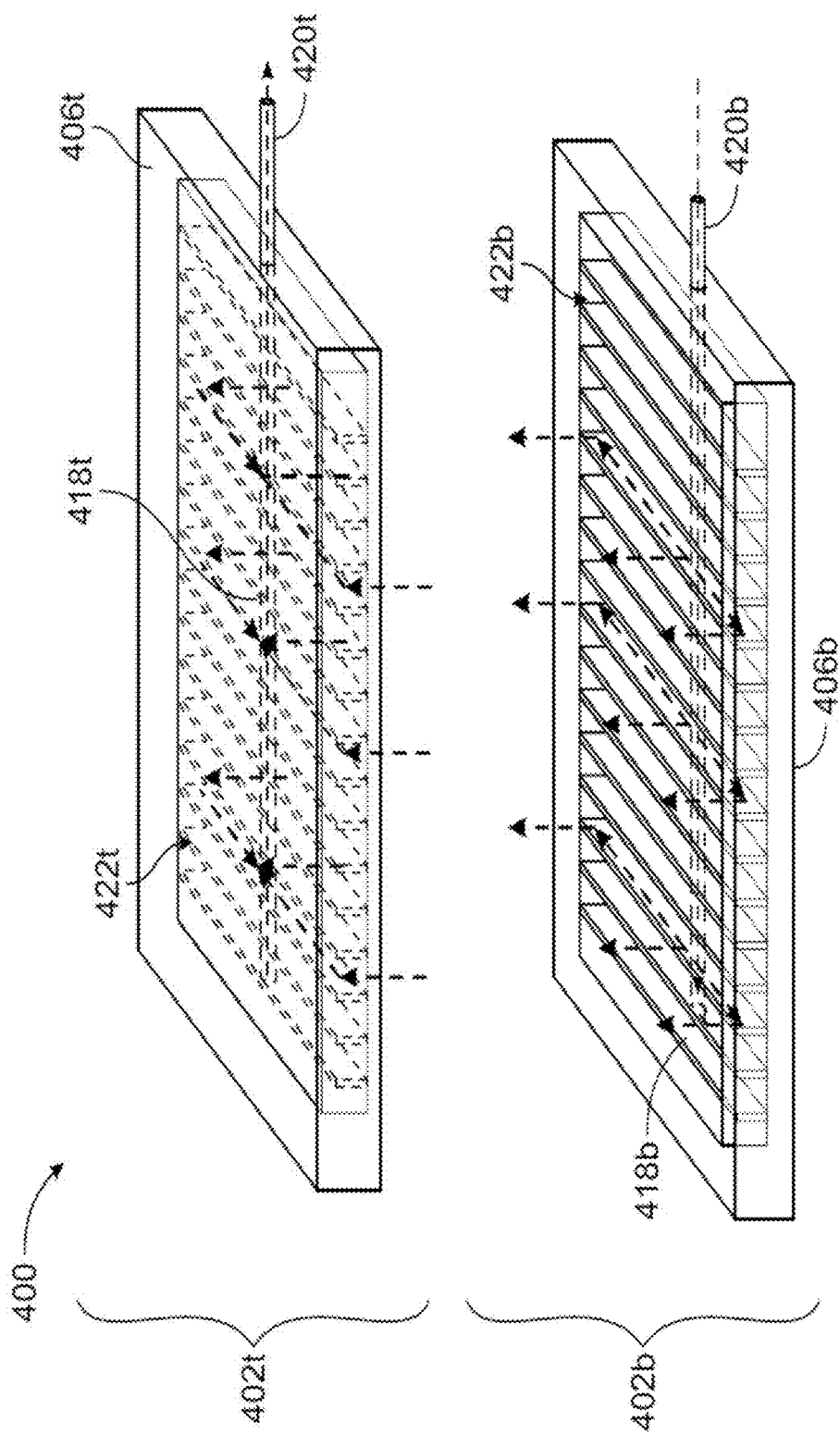

FIGS. 4A-4F together illustrate an embodiment of a cold plate 400. FIG. 4A is an exploded perspective drawing; FIG. 4B is a top view of an embodiment of a frame; FIG. 4C is a side view of an embodiment of a frame; FIG. 4D is a side view of a pair of frames being assembled; and FIG. 4E is a side view of an embodiment of an assembled cold plate; and FIG. 4F is an exploded perspective view showing the fluid flow path through the cold plate during an embodiment of its operation.

Cold plate 400 includes a first or bottom frame 402$b$ coupled to a second or top frame 402$t$. First frame 402$b$ includes a frame body 404$b$ with a planar first base surface 406$b$ that is spaced apart from, and substantially parallel to, an annular first mating surface 408$b$. Base surface 406$b$ and mating surface 408$b$ are connected along their perimeters by a plurality of exterior sidewalls 410$b$. The terms "annulus" or "annular" are commonly understood as the ring-shaped region between concentric circles with different radii—or, put differently, as the area that results when one circle is subtracted from the area of a larger concentric circle. But as used herein, the terms "annulus" or "annular" are broader and refer to any shape that results when the area of one shape is subtracted from the area of a larger shape, whether or not the shapes are concentric and whether or not they are scaled versions of the same basic shape. This definition of "annulus" or "annular" encompasses the common understanding of the terms, but also includes other polygonal shapes such as squares, rectangles, triangles, trapezoids, etc., as well as non-polygonal shapes such as ellipses. Thus, annular mating surface 408$b$ can be considered a quadrilateral annulus (see FIG. 4B).

A recess 412$b$ is formed in frame body 404$b$. The recess extends into frame body 404$b$ from a plane defined by mating surface 408$b$ to a position between mating surface 408$b$ and base surface 406$b$ (see, e.g., FIG. 4C). Recess 412$b$ includes a bottom 414$b$ and a plurality of interior sidewalls 416$b$. A fluid channel 418$b$ is positioned along bottom 414$b$. In the illustrated embodiment, fluid channel 418$b$ is positioned in frame body 404$b$ under bottom 414$b$ and extends through exterior sidewall 410$b$, so that the fluid channel fluidly connects the interior of recess 412$b$ to the exterior of frame body 404$b$. In other embodiments, fluid channel 418$b$ can be positioned differently than shown; for instance, in other embodiments fluid channel 418$b$ can be positioned within recess 412$b$, in which case it extends through interior sidewall 416$b$ and exterior sidewall 410$b$ to reach the exterior of the frame body. A fluid port 420$b$ is positioned on an exterior sidewall 410$b$ and is fluidly coupled to fluid channel 418$b$, so that fluid can be delivered to or extracted from fluid channel 418$b$ from a source line or return line fluidly coupled to the port. Although in the illustrated embodiment fluid channel 418$b$ and fluid port 420$b$ both have a quadrilateral cross-section, other embodiments can have a cross-section that make it easier to attach hoses and fittings, such as a circular cross-section. In still other embodiments, fluid channel 418$b$ and fluid port 420$b$ need not have the same cross-sectional shape.

A set of heat transfer fins 422$b$ is formed in, or inserted in, recess 412$b$. The fin set 422$b$ includes one or more individual heat transfer fins. Each individual fin is substantially rectangular and has a first edge 424, as second edge 426, a first end 428, and a second end 430. Fin set 422$b$ is positioned in recess 412$b$ with first edges 424 in thermal contact with bottom 414$b$ and second edges 426 substantially flush with a plane of the mating surface 408$b$. Each fin in fin set 422$b$ extends across a dimension of recess 412$b$, so that for each fin its first end 428 is positioned in contact with one interior sidewall 416b and its second end is positioned in contact with an opposite interior sidewall. In an embodiment where fins 422b are directly formed in recess 412b, there is no edge 424 since the fins are directly formed on the surface of bottom 414b.

Second or top frame 402t is substantially identical to first or bottom frame 402b, so that each element of bottom frame 402b finds an identical corresponding element in top frame 402t. Hence why cold plate 400 is described as symmetrical: it includes two identical halves, even if the two halves are not positioned in a way that results in a perfectly symmetrical cold plate (see, e.g., FIG. 8). Thus, top frame 402t includes a frame body 404t with a planar second base surface 406t that is spaced apart from, and substantially parallel to, an annular second mating surface 408t, and base surface 406t and mating surface 408t are connected along their perimeters by exterior sidewalls 410t. Recess 412t includes a bottom 414t and a plurality of interior sidewalls 416t. A fluid channel 418t is positioned along bottom 414t. In the illustrated embodiment, fluid channel 418t is positioned in frame body 404t under bottom 414t and extends through exterior sidewall 410t, so that the fluid channel fluidly connects the interior of recess 412t to the exterior of frame body 404t. A fluid port 420t is positioned on an exterior sidewall 410t and is fluidly coupled to fluid channel 418t, so that fluid can be delivered to or extracted from fluid channel 418b from a source line or return line fluidly coupled to the port. Although in the illustrated embodiment fluid channel 418t and fluid port 420t both have a quadrilateral cross-section, other embodiments can have a cross section that make it easier to attach hoses and fittings, such as a circular cross section. In still other embodiments, fluid channel 418b and fluid port 420b need not have the same cross-sectional shape.

A set of heat transfer fins 422t is formed in, or inserted in, recess 412t in the same way as fins 422b are formed in, or inserted in, recess 412b. Fin set 422t is positioned in recess 412t with first edges 424 in thermal contact with bottom 414t and second edges 426 substantially flush with a plane of the mating surface 408t. Each fin in fin set 422t extends across a dimension of recess 412t, so that for each fin its first end 428 is positioned in contact with one interior sidewall 416t and its second end is positioned in contact with an opposite interior sidewall.

As best shown in FIGS. 4D-4E, cold plate 400 is formed by joining first or bottom frame 402b to second or top frame 402t. To assemble cold plate 400, second frame 402t is brought together with first frame 402b so that second mating surface 408t is in contact with first mating surface 408b. When positioned with mating surfaces 408b and 408t in contact, recesses 412b and 412t form a fluid chamber 432. Fin sets 422b and 422t are positioned so that, when the top and bottom frames are joined, the second edge 426 of each individual fin in fin set 422b will be in contact with the second edge of a corresponding fin in fin set 422t. As a result, fin sets 422b and 422t together form a plurality of fin channels within fluid chamber 432. Fasteners can be inserted in mounting channels 434 to keep top frame 402t securely attached to mating surface 408b of 402b. To prevent cooling fluid from leaking out of chamber 432, a seal can be formed at the interface of mating surfaces 408b and 408t, as further discussed below in connection with FIGS. 5A-6B.

FIG. 4F illustrates the operation of cold plate 400 and an embodiment of the fluid path through the cold plate. The fluid path is shown by the dashed arrows in the figure. In operation, first base surface 406b is thermally coupled to a heat-generating electronic component, such as a microprocessor (not shown in this figure, but see FIGS. 3 and 9A-10B). The thermal coupling between base surface 406b and an electronic component can be by direct contact or by indirect contact via a thermal interface material. A fluid supply line is connected to port 420b and a fluid return line in connected to port 402t, as shown in FIG. 3. As the component generates heat, cool fluid from a fluid supply coupled to port 420b enters the port and flows into and through fluid channel 418b into chamber 432 (not shown in this exploded view, but see FIG. 4E). Fluid channel 418b distributes the cool fluid into the fin channels—i.e., the spaces between fins in chamber 432. Heat from the component flows by conduction through first base surface 406b, into the individual fins, and from the fins into the fluid in the fin channels. As fluid flows through the fin channels in bottom frame 402b, it absorbs heat from the heat transfer fins, becomes hotter, and flows from the fin channels in bottom fin set 422b into the corresponding fin channels in top fin set 422t. From the fin channels in top fin set 422t, the fluid flows into fluid channel 418t and then flows through fluid channel 418t to port 420t, where the now-heated fluid exits the cold plate into a return line. In other embodiments, the flow through cold plate 400 can be reversed, with port 420t functioning as an inlet port, port 420b functioning as an outlet port, and the flow through the interior of the cold plate going in a direction opposite to what is shown in the figure.

Figure 5B:
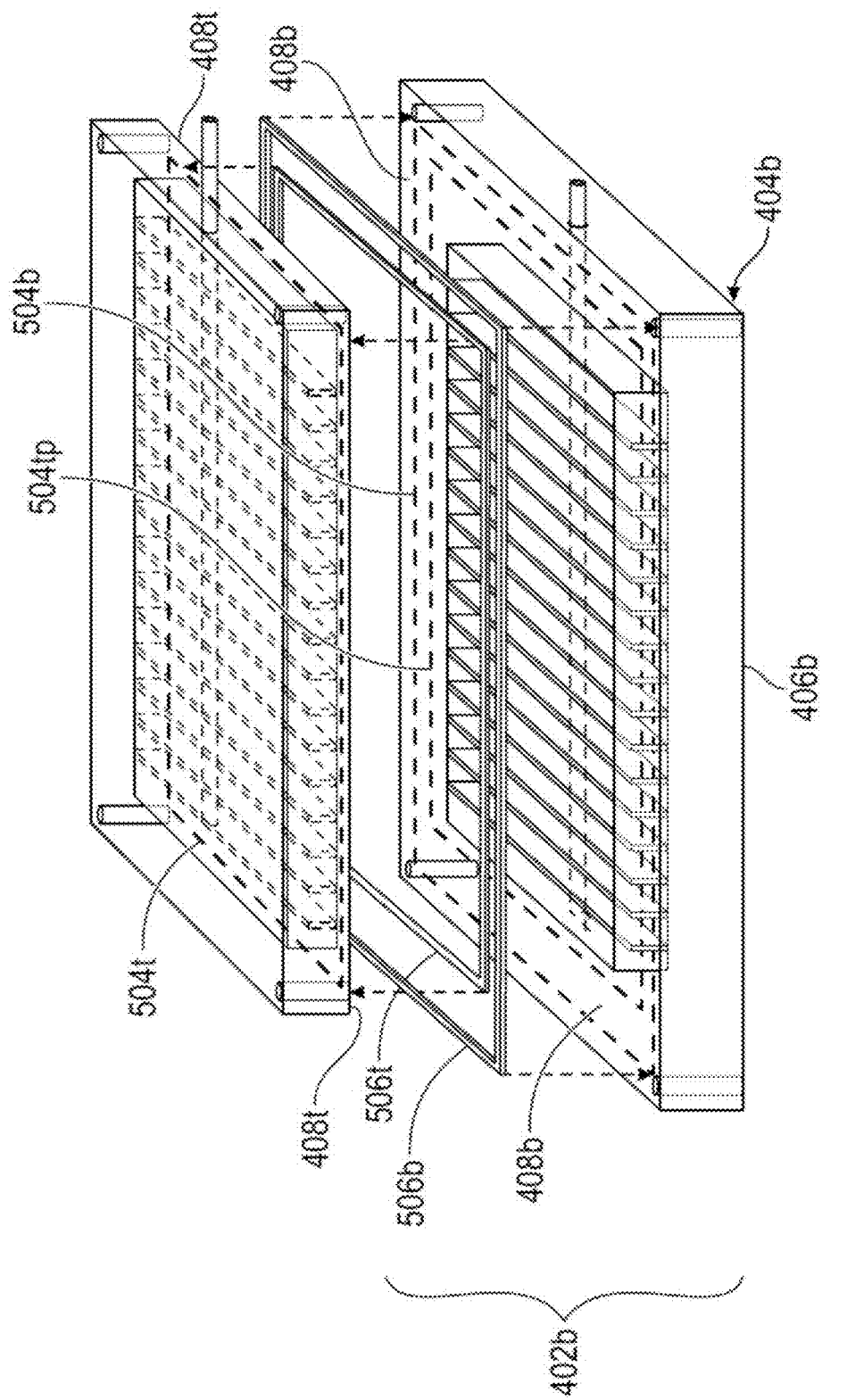

FIGS. 5A-5B illustrate embodiments of sealing arrangements for a cold plate such as cold plate 400. When first frame 402b and second frame 402t are assembled as described above for FIGS. 4D-4E, it can be necessary to provide a seal to prevent fluid from leaking from chamber 132 during operation of the cold plate. FIG. 5A illustrates an embodiment in which first mating surface 408b includes a sealing groove 502b formed in the surface and second mating surface 408t include a second sealing groove 502t formed in the surface. Sealing notches or grooves 502b and 502t are positioned in their respective mating surfaces so that they will align when mating surface 408t is placed in contact with mating surface 408b and first frame 402b is secured to second frame 402t using mounting channels 434. In one embodiment, sealing grooves 502b and 502t both have a semi-circular cross-section, so that when mating surfaces 408b and 408t are brought together sealing grooves 502b and 502t together form a circular channel. In other embodiments, sealing grooves 502b and 502t can have shapes other than semi-circular.

A seal (not shown in this drawing, but see, e.g., FIGS. 6A-6B) positioned in aligned grooves 502t and 502b to completes the sealing. In an embodiment where sealing grooves 502b and 502t are semicircular, the seal can be an O-ring, but in other embodiments other seals with different cross-sectional shapes can be used—e.g., square, rectangular, triangular, elliptical, semi-circular can be used in different embodiments. The dimensions and sizes of the seals 506b and 506t should match with the groove structures. In one embodiment the seal can expand with temperature; the thermal expansion parameters should be carefully designed so that the seals expand with increasing temperature and shrink with decreasing temperature, but the minimum size should satisfy the sealing requirement.

FIG. 5B illustrates another embodiment of a sealing arrangement for cooling plate 200. In the illustrated embodiment, first mating surface 408b includes a sealing groove 504b formed in the surface and second mating surface 408t include a second sealing groove 502t formed in the surface. In addition to groove 504t, the projection 504tp of groove 504t, also indicated onto first mating surface 408b is shown in the drawing. In this embodiment, then, sealing grooves 504b and 504tb are positioned in their respective surfaces so that they do not align when mating surface 408t is placed in contact with mating surface 408b. Instead, one groove has different dimensions than the other, so that when the mating surfaces are placed in contact one groove will be entirely within the perimeter of the other; one could describe grooves 504b and 504t as concentric, except that they need not share the same center, although they can in some embodiments.

Seals 506b and 506t can be positioned in grooves 504t and 504b to complete the seal. In one embodiment, each seal can be an O-ring, but in other embodiments other seals with different cross-sectional shapes can be used—e.g., square, rectangular, triangular, elliptical, semi-circular can be used in different embodiments. This arrangement can be helpful because it provides redundancy: if one seal fails, there is another to maintain the seal. The different locations and/or dimensions of the notches are can also improve sealing performance. The dimensions and sizes of the seals 506b and 506t should match with the groove structures. In one embodiment, seals 506b and 506t can expand with temperature; the thermal expansion parameters should be carefully designed so that the seals expand with increasing temperature and shrink with decreasing temperature, but the minimum size should satisfy the sealing requirement.

Figure 6A:
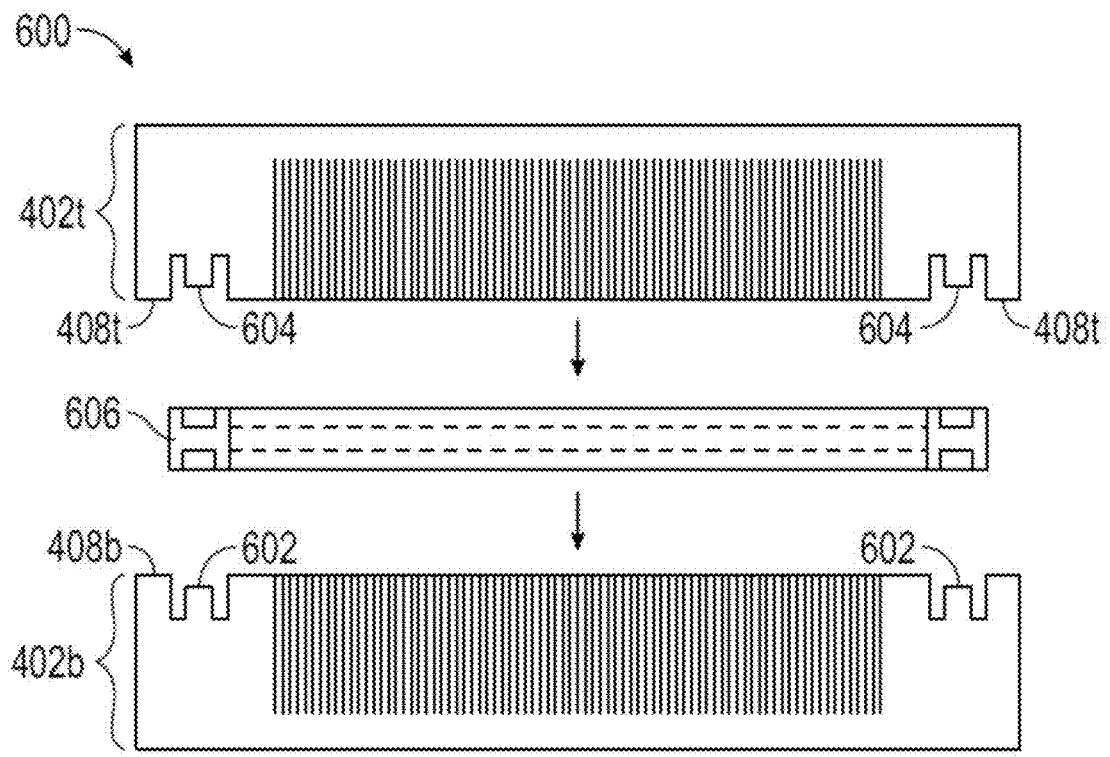
FIGS. 6A-6B are side views of an embodiment of a sealing arrangement in a cold plate.
Figure 6B:
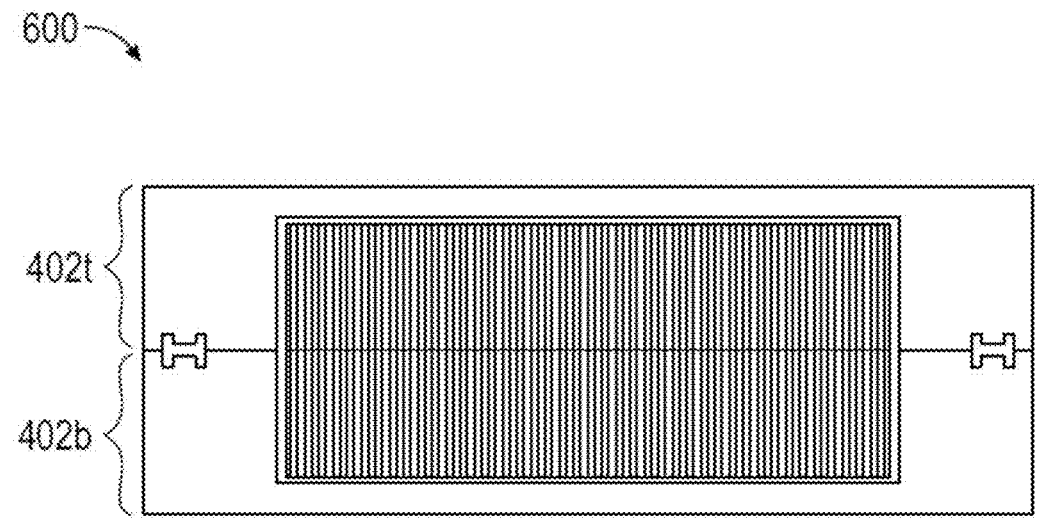

FIGS. 6A-6B together illustrate another embodiment of a sealing arrangement for a cold plate 600. FIG. 6A is an exploded view, FIG. 6B an assembled view. Cold plate 600 is in most respects similar to cold plate 400: it includes a first or bottom frame 402b and a second or top frame 402t, both of which are built as described above for cold plate 400. The primary difference in cold plate 600 is the sealing arrangement.

In cold plate 600, first mating surface 408b has a notch or groove 602 formed therein whose cross-section is shaped like the lower half of the letter H. Second mating surface 408t similarly has a notch or groove 604 formed therein whose cross-section is shaped like the upper half of the letter H. Grooves 602 and 604 are aligned, so that when top frame 402t is joined to bottom frame 402b, such that second mating surface 408t is in contact with first mating surface 408b, grooves 602 and 604 together form a channel with an H-shaped cross-section (see FIG. 6B). To complete the seal, a sealing pad 606 with an H-shaped cross-section is inserted in the channel formed by grooves 602 and 604. H-shaped sealing pad 606 provides enhanced sealing of the entire package. The dimensions and sizes of sealing pad 606 should match with the groove structures. In one embodiment, seals 506b and 506t can expanding with temperature; the thermal expansion parameters should be carefully designed so that the seals expand with increasing temperature and shrink with decreasing temperature, but the minimum size should satisfy the sealing requirement.

Figure 7:
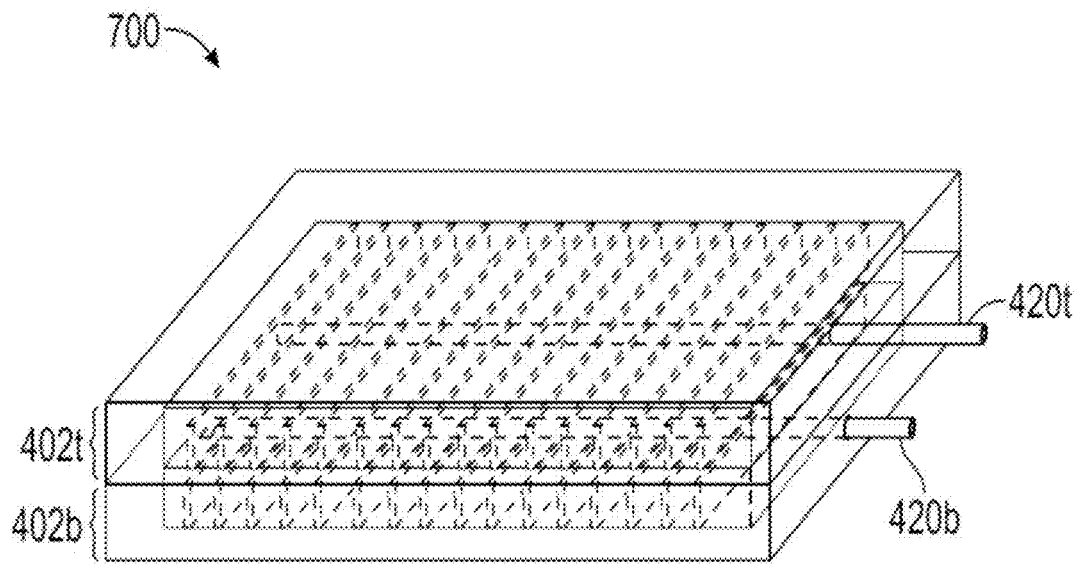
FIGS. 7-8 are perspective drawings of embodiments of a cold plate with different placements of the frames relative to each other.
Figure 8:
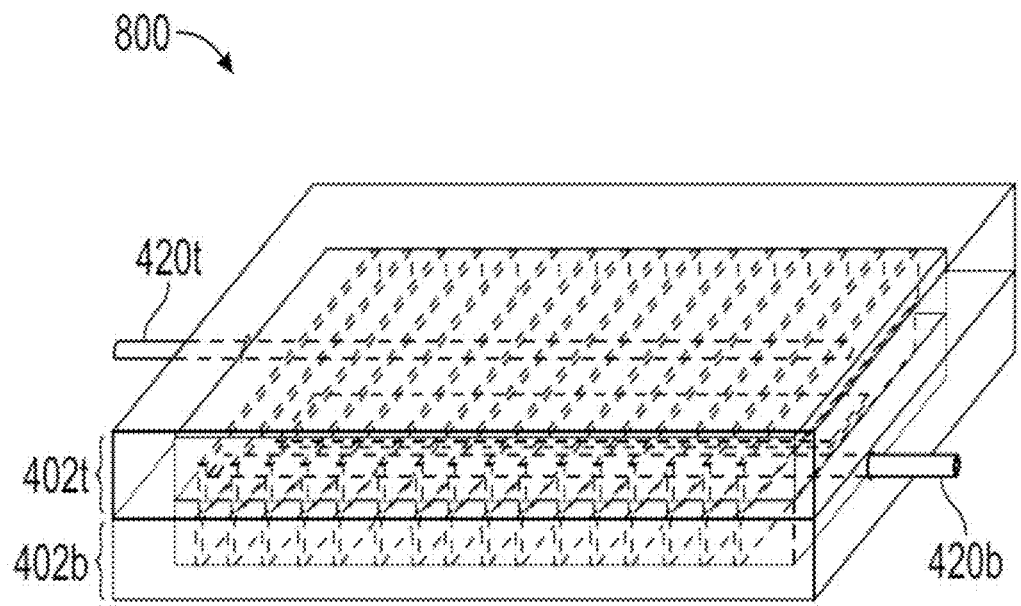

FIGS. 7-8 illustrate additional embodiments of cold plates. FIG. 7 illustrates an embodiment of a cold plate 700. Cold plate 700 is arranged substantially as shown and described above for cold plate 400, with first frame 402b and second frame 402 assembled so that ports 420b and 420t are aligned on the same side of the cold plate. This embodiment is a fully symmetrical arrangement, since it uses identical frames and is symmetrical about a plane between the two frames. FIG. 8 illustrates an embodiment of a cold plate 800 in which first frame 402b and second frame 402t are assembled so that ports 420b and 420t end up on opposite sides of the cold plate. This embodiment is a partially symmetrical arrangement, since it uses identical frames but is asymmetrical about a plane between the two frames. Cold plate 800 can be used, for instance, in applications where there are multiple cold plates but insufficient space to install all the required hoses and connectors on one side of the cold plate. Fluid distribution within cold plate 800 remains similar, but the inlet/outlet arrangement can be more flexible for different use cases.

Figure 9A:
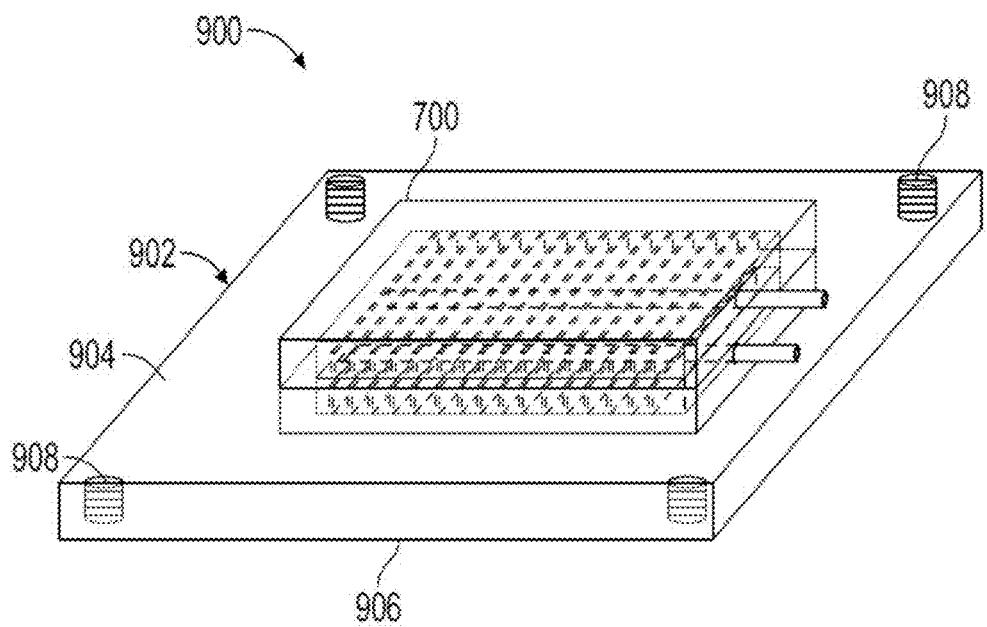
FIGS. 9A-9C are drawings of an embodiment of a cold plate in a mounting structure.
Figure 9B:
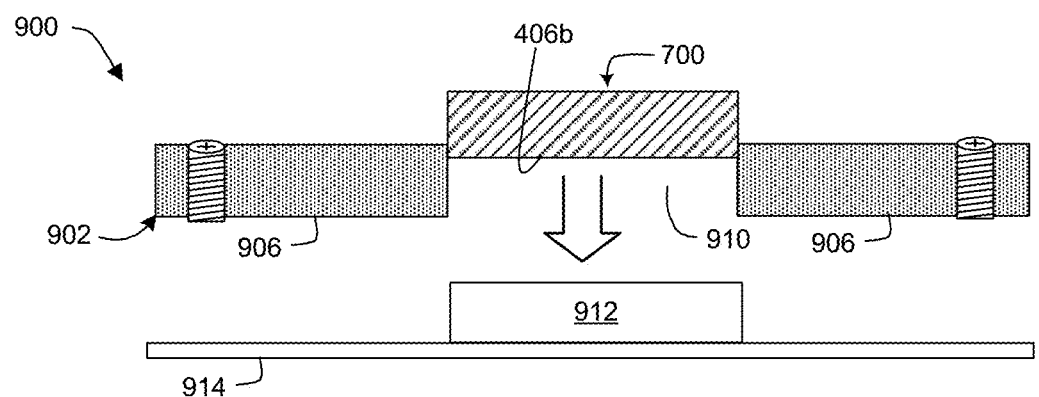
Figure 9C:
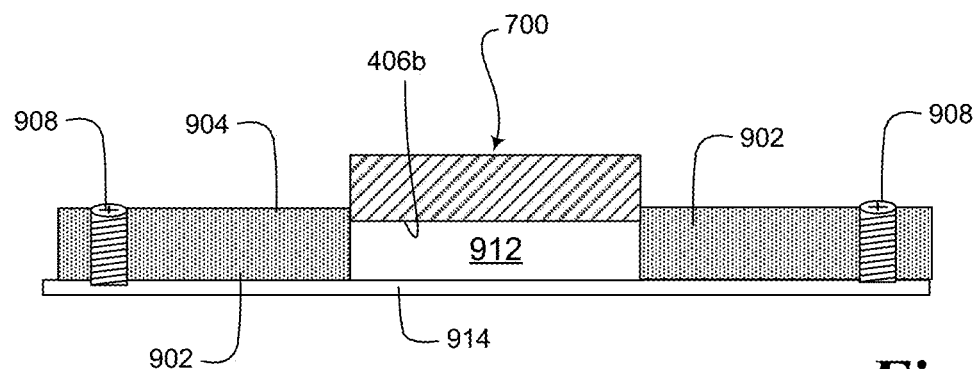

FIGS. 9A-9C together illustrate an embodiment of a cold plate assembly 900 using a mounting structure. FIG. 9A is a perspective view, FIG. 9B an exploded cross-sectional view, and FIG. 9C an assembled cross-sectional view. In some situations, it can be difficult or impossible to attach a cold plate such as cold plates 400, 700, or 800 directly to an electronic component. Cold plate assembly 900 can be useful in these situations.

In cold plate assembly 900, a cold plate 700 is coupled to a mounting structure 902. Although the illustrated embodiment of cold plate assembly 900 uses cold plate 700, other embodiments could use other cold plates, such as cold plates 400, 600, or 800. Mounting structure 902 includes an opening 910 that extends through the entire thickness of the mounting structure, from top surface 904 to bottom surface 906, and is sized and shaped to receive at least part of cold plate 700 so that its first base surface 406b is exposed on a lower part of the mounting structure. In one embodiment, cold plate 700 can be secured in opening 910 by press fitting the cold plate into the opening, but in other embodiments the cold plate can be secured to the mounting structure differently. In some embodiments mounting structure 902 can be thermally conductive, so that it functions as a heat conducting plate. In another embodiment, mounting structures can be formed directly on the cold plate frames instead of using a separate mounting structure, and in still other embodiments other fluid parts can be assembled on the mounting structure if need.

In operation, a heat-generating electronic component, such as a processor 912, is mounted on a substrate 914. To cool processor 912, cold plate assembly is lowered onto processor 912 until first base surface 406b of cold plate 700 is thermally coupled to processor 912. When the first base surface is thermally coupled to the processor, bottom surface 906 rests on a surface of substrate 914 that surrounds the processor. One or more fasteners 908 can then be inserted into mounting structure 902 and substrate 914 to secure cold plate assembly 900 in place, as shown in FIG. 9C. Cold plate assembly 900 eliminates any dependency of the cold plate installation on the processor.

Figure 10A:
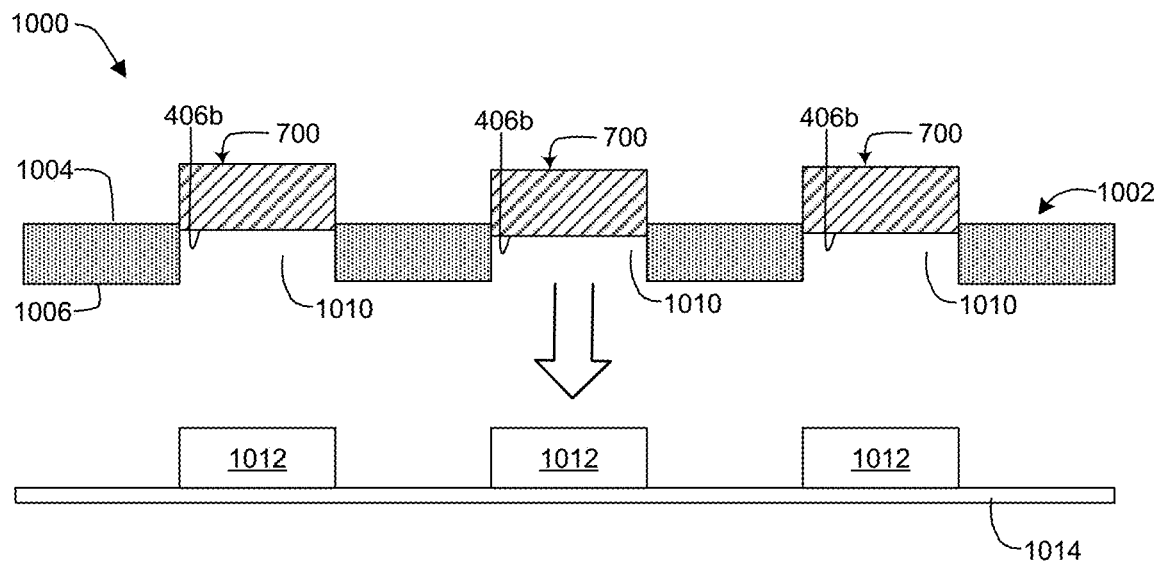
FIGS. 10A-10B are cross-sectional drawings of an embodiment including multiple cold plates in a mounting structure.
Figure 10B:
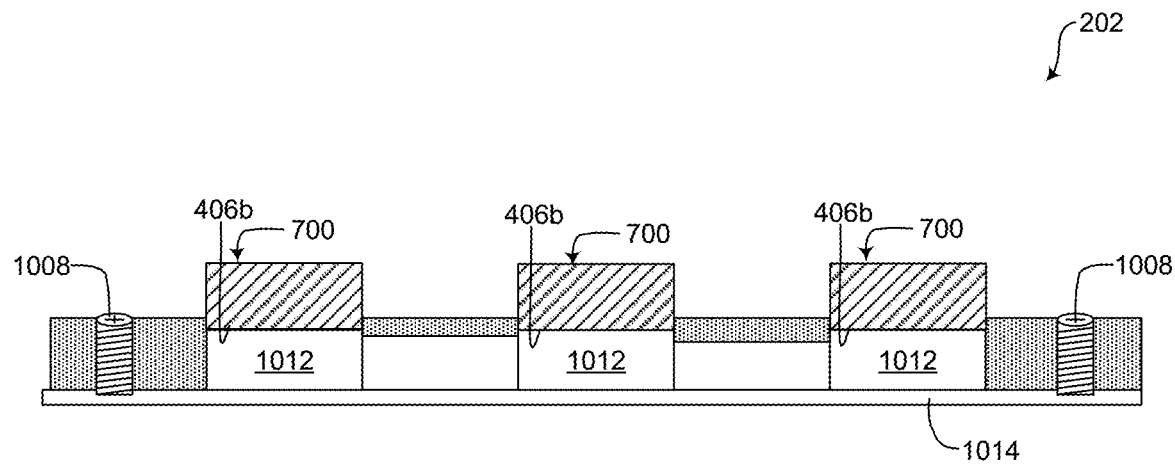

FIGS. 10A-10B together illustrate another embodiment of a cold plate assembly 1000 using a mounting structure. FIG. 10A is an exploded cross-sectional view, and FIG. 10B an assembled cross-sectional view. Cold plate assembly 1000 is similar to cold plate assembly 900; the primary difference is that cold plate assembly 1000 can accommodate multiple cold plates. In the illustrated embodiment, all cold plates are cold plates 700, but in other embodiments the cold plates can be any of the other cold plates disclosed herein, and in still other embodiments not all cold plates in cold plate assembly 1000 need be the same cold plate.

In cold plate assembly 1000, multiple cold plates 700 are coupled to a mounting structure 1002. Mounting structure 1002 includes multiple openings 1010 that extend through the entire thickness of the mounting structure, from top surface 1004 to bottom surface 1006, and is sized and shaped to receive at least part of cold plate 700 so that its first base surface 406b is exposed on a lower part of the mounting structure. In the illustrated embodiment the thickness of mounting structure 1002 is substantially uniform, but that need not be the case in other embodiments. In other embodiments, for instance, the thickness of the mounting structure can be thicker around its perimeter than in the space between cold plates 700. In one embodiment, cold plate 700 can be secured in opening 910 by press fitting the cold plate into the opening, but in other embodiments the cold plate can be secured to the mounting structure differently. In some embodiments mounting structure 1002 can be thermally conductive, so that it functions as a heat conducting plate. In another embodiment, mounting structures can be formed directly on the cold plate frames instead of using a separate mounting structure, and in still other embodiments other fluid parts can be assembled on the mounting structure if need.

In operation, multiple heat-generating electronic components, such as processors 1012, are mounted on a substrate 1014. To cool processors 1012, cold plate assembly 1000 is lowered onto substrate 1014 and processors 1012 until first base surface 406*b* of every cold plate 700 is thermally coupled to a corresponding processor 1012. When the first base surfaces 406*b* are thermally coupled to their corresponding processors, bottom surface 1006 rests on a surface of substrate 1014 that surrounds the processors. One or more fasteners 1008 can then be inserted into mounting structure 1002 and substrate 1014 to secure cold plate assembly 1000 in place, as shown in FIG. 10B.

Other embodiments of a cold plate are possible besides the ones described above. For instance:

Different types of packaging solutions for assembling upper frame and lower frame can be implemented.

Different type of sealing channel and the corresponding sealing pad can be used for performance and reliability enhancement.

The above description of embodiments is not intended to be exhaustive or to limit the invention to the described forms. Specific embodiments of, and examples for, the invention are described herein for illustrative purposes, but various modifications are possible.

What is claimed is:

1. A cold plate comprising:
   a first frame including:
      a first frame body having a planar first base surface, an annular first mating surface, and at least one exterior sidewall, wherein the first mating surface is spaced apart from the planar base surface and surrounds a first recess in the first frame body, the first recess having a bottom and at least one interior sidewall,
      a plurality of first heat transfer fins positioned in the first recess, each first heat transfer fin having a first edge thermally coupled to the bottom and a second edge positioned substantially at a plane defined by the first annular mating surface,
      a first fluid channel positioned at the bottom of the first recess, and
      a first fluid port positioned in the at least one frame sidewall, the fluid port being fluidly coupled to the first fluid channel;
   a second frame including:
      a second frame body having a planar second base surface, an annular second mating surface, and at least one exterior sidewall, wherein the second mating surface is spaced apart from the second base surface and surrounds a second recess in the second frame body, the second recess having a bottom and at least one interior sidewall,
      a plurality of second heat transfer fins positioned in the second recess, each second heat transfer fin having a first edge thermally coupled to the bottom of the second recess and a second edge positioned substantially at a plane defined by the second annular mating surface, wherein each second heat transfer fin has a corresponding first heat transfer fin and wherein each second heat transfer fin is separate from the corresponding first heat transfer fin,
      a second fluid channel positioned at the bottom of the second recess, and
      a second fluid port positioned in the at least one frame sidewall, the fluid port being fluidly coupled to the second fluid channel;
   wherein the second mating surface is positioned in sealing contact with the first mating surface so that the first recess and the second recess form a fluid chamber and wherein the second edge of each first heat transfer fin is in contact with the second edge of a corresponding second heat transfer fin, so that the plurality of first heat transfer fins and the plurality of second heat transfer fins form a plurality of fin channels in the fluid chamber.

2. The cold plate of claim 1, wherein the first fluid port and the second fluid port are fluidly coupled via their fluid channels to the plurality of fin channels, wherein the first fluid port is an inlet port that delivers fluid to the first fluid channel and the second fluid port is an outlet port that extracts fluid from the second fluid channel.

3. The cold plate of claim 1 wherein the first recess and the second recess are quadrilateral and the heat transfer fins in the first and second pluralities of heat transfer fins have one end positioned at one interior sidewall and another positioned at an opposite interior sidewall.

4. The cold plate of claim 1, further comprising a first groove formed in the first mating surface and a second groove formed in the second mating surface.

5. The cold plate of claim 4 wherein the first groove and the second groove align with each other the first mating surface is mated to the second mating surface, and further comprising a seal positioned in the first groove and the second groove.

6. The cold plate of claim 5, wherein the first and second grooves together form an H-shaped channel, and wherein the seal has an H-shaped cross section and is positioned in the H-shaped channel.

7. The cold plate of claim 4 wherein the first groove and the second groove do not align with each other the first mating surface is mated to the second mating surface, and further comprising a first seal positioned in the first groove and a second seal positioned in the second groove.

8. The cold plate of claim 1 wherein the first frame and the second frame are identical in shape.

9. The cold plate of claim 1 wherein:
   the second frame is coupled to the first frame with the first port and the second port aligned on the same side of the cold plate, or
   the second frame is coupled to the first frame with the first port and the second port on different sides of the cold plate.

10. The cold plate of claim 1, further comprising a plurality of mounting channels extending through the first frame and the second frame to mount the cold plate to a heat source with the first base surface thermally coupled to the heat source.

11. A cooling system comprising:
   a fluid supply and a fluid return;
   at least one cold plate fluidly coupled to the fluid supply and the fluid return, wherein the at least one cold plate comprises:

a first frame including:
   a first frame body having a planar first base surface, an annular first mating surface, and at least one exterior sidewall, wherein the first mating surface is spaced apart from the planar base surface and surrounds a first recess in the first frame body, the first recess having a bottom and at least one interior sidewall,
   a plurality of first heat transfer fins positioned in the first recess, each first heat transfer fin having a first edge thermally coupled to the bottom and a second edge positioned substantially at a plane defined by the first annular mating surface,
   a first fluid channel positioned at the bottom of the first recess, and
   a first fluid port positioned in the at least one frame sidewall, the fluid port being fluidly coupled to the first fluid channel;
a second frame including:
   a second frame body having a planar second base surface, an annular second mating surface, and at least one exterior sidewall, wherein the second mating surface is spaced apart from the second base surface and surrounds a second recess in the second frame body, the second recess having a bottom and at least one interior sidewall,
   a plurality of second heat transfer fins positioned in the second recess, each second heat transfer fin having a first edge thermally coupled to the bottom of the second recess and a second edge positioned substantially at a plane defined by the second annular mating surface, wherein each second heat transfer fin has a corresponding first heat transfer fin and wherein each second heat transfer fin is separate from the corresponding first heat transfer fin,
   a second fluid channel positioned at the bottom of the second recess, and
   a second fluid port positioned in the at least one frame sidewall, the fluid port being fluidly coupled to the second fluid channel;
wherein the second mating surface is positioned in sealing contact with the first mating surface so that the first recess and the second recess form a fluid chamber and wherein the second edge of each first heat transfer fin is in contact with the second edge of a corresponding second heat transfer fin, so that the plurality of first heat transfer fins and the plurality of second heat transfer fins form a plurality of fin channels in the fluid chamber.

12. The cooling system of claim 11, wherein the first fluid port and the second fluid port are fluidly coupled via their fluid channels to the plurality of fin channels, wherein the first fluid port is an inlet port that delivers fluid to the first fluid channel and the second fluid port is an outlet port that extracts fluid from the second fluid channel, and wherein the fluid supply delivers cool fluid and is fluidly coupled to the first fluid port and the fluid return extracts hot fluid and is fluidly coupled to the second fluid port.

13. The cooling system of claim 11 wherein the first recess and the second recess are quadrilateral and the heat transfer fins in the first and second pluralities of heat transfer fins have one end positioned at one interior sidewall and another positioned at an opposite interior sidewall.

14. The cooling system of claim 11 wherein the at least one cold plate further comprises a first groove formed in the first mating surface and a second groove formed in the second mating surface.

15. The cooling system of claim 14 wherein the first groove and the second groove align with each other the first mating surface is mated to the second mating surface, and further comprising a seal positioned in the first groove and the second groove.

16. The cooling system of claim 15, wherein the first and second grooves together form an H-shaped channel, and wherein the seal has an H-shaped cross section and is positioned in the H-shaped channel.

17. The cooling system of claim 14 wherein the first groove and the second groove do not align with each other the first mating surface is mated to the second mating surface, and further comprising a first seal positioned in the first groove and a second seal positioned in the second groove.

* * * * *